United States Patent

Egbert et al.

[15] 3,662,287

[45] May 9, 1972

[54] VOLTAGE CONTROLLED OSCILLATOR MULTIPLIER

[72] Inventors: Harry F. Egbert, Port Hueneme; James R. Falls, Jr., Camarillo, both of Calif.

[73] Assignee: The United States of America as represented by the Secretary of the Navy

[22] Filed: Feb. 24, 1971

[21] Appl. No.: 118,274

[52] U.S. Cl. ..........................331/117, 321/69 NL, 331/53, 331/177 V, 334/15

[51] Int. Cl. ..........................H02m 5/20

[58] Field of Search ..........331/117 D, 117, 36 C, 53, 177 V; 334/15; 321/69 NL

[56] References Cited

UNITED STATES PATENTS 3,397,369 8/1968 Uhlir, Jr. ..........................321/69 NL

*Primary Examiner*—John Kominski
*Attorney*—R. S. Sciascia and H. H. Losche

[57] ABSTRACT

A voltage controlled oscillator and varactor multiplier circuit having a varactor network coupling the output of an oscillator through a band pass filter to an output in which a single varactor produces frequencies tuned by varying the bias thereon and produces frequency multiplication.

4 Claims, 3 Drawing Figures

INVENTORS.
HARRY F. EGBERT &
JAMES R. FALLS, JR.
BY
H. H. Losche
ATTORNEYS

VOLTAGE CONTROLLED OSCILLATOR MULTIPLIER

BACKGROUND OF THE INVENTION

This invention relates to voltage controlled oscillators and more particularly to voltage controlled oscillator multiplier circuits utilizing a single varactor network with a direct current adjustable bias for controlling the output frequency and which varactor also produces frequency multiplication.

In prior known voltage controlled oscillator multipliers (V-COM) where varactors are used, one varactor is used to control the frequency and a second varactor is used as the multiplier. The varactor used to control frequency has the capacitance thereof controlled by variable bias. The multiplier stage was designed with the multiplier diode biased for maximum conversion efficiency at the operating power level. The input port of the multiplier is matched to present the desired operating admittance at $f_o$ for a given bias condition. Any adjustment to the bias voltage will then cause the input admittance to vary from the design value. In all previous designs where oscillators and multipliers have been combined, this variation of multiplier input admittance has been considered undesirable and ferrite isolators or resistive attenuators have been commonly inserted to isolate the oscillator from the multiplier.

When the sum of the bias and the radio frequency (R.F.) voltage developed across a diode exceeds the reverse breakdown voltage or forward conduction voltage, direct current will flow. If the diode is coupled to the resonant tank circuit of an oscillator, it will generate frequency modulation (FM) noise due to this current flow. In the case of high power oscillators it becomes very difficult to couple a tuning diode tightly to the resonant tank circuit without having the reverse breakdown or forward conduction voltage exceeded when the control voltage is adjusted for large frequency variations. Therefore, when controlling high power oscillators, it becomes necessary to use tuning diodes that have large junction capacitance and high reverse voltage breakdown to obtain maximum capacitance change with voltage and a large voltage dynamic range. Tuning diodes meeting these requirements are the highest priced. The multiplier varactor diode used in high power applications already satisfies these two requirements which makes the VCOM tuning method exceptionally attractive in high power applications.

SUMMARY OF THE INVENTION

In the present invention a varactor diode network is combined with an oscillator and a band pass filter which single diode varactor serves the dual function of the tuning diode for the oscillator and for the frequency multiplication. The single varactor diode has an adjustable direct current (DC) bias for frequency tuning of the varactor by changing the capacitive reactance thereof. The varactor's inherent characteristics of producing harmonics provides the means of frequency multiplication which harmonic is filtered in the band pass filter for the desired frequency. Idlers may be used for the desired multiplication factor since they are effective in raising the gain and in reducing noise of the desired frequency. Accordingly, it is a general object of this invention to provide a solid state voltage controlled oscillator multiplier circuit having a single varactor diode that is adjustably biased to control output frequency and to provide frequency multiplication.

BRIEF DESCRIPTION OF THE DRAWING

These and other objects and the attendant advantages, features and uses will become more apparent to those skilled in the art as a more detailed description proceeds when considered along with the accompanying drawing in which.

DESCRIPTION OF THE PREFERRED EMBODIMENT

Figure 1:
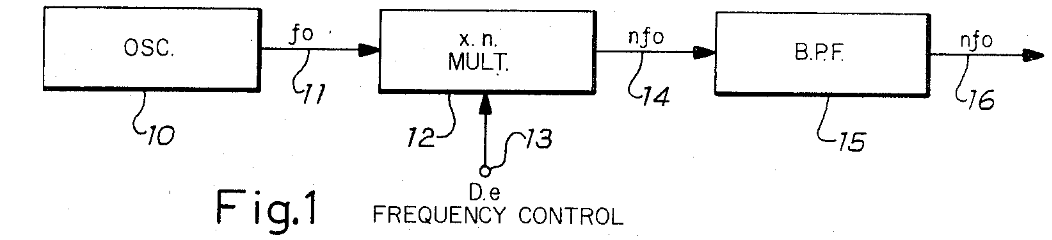
FIG. 1 is a block diagram of the components making up the combination of the voltage controlled oscillator multiplier.

Referring more particularly to FIG. 1 the combination of components making up the VCOM consists of an oscillator 10, a multiplier 12, and a band pass filter 15 in series intercoupled arrangement to produce the desired frequency on an output 16. The oscillator 10 produces a fundamental frequency $f_o$ on the output 11 which is multiplied and frequency controlled in the multiplier 12 to produce a controlled frequency $nf_o$ on the output 14. Terminal 13 receives a DC bias control voltage to control the frequency and the band pass filter 15 passes the desired frequency $nf_o$ on the output 16.

Figure 2:
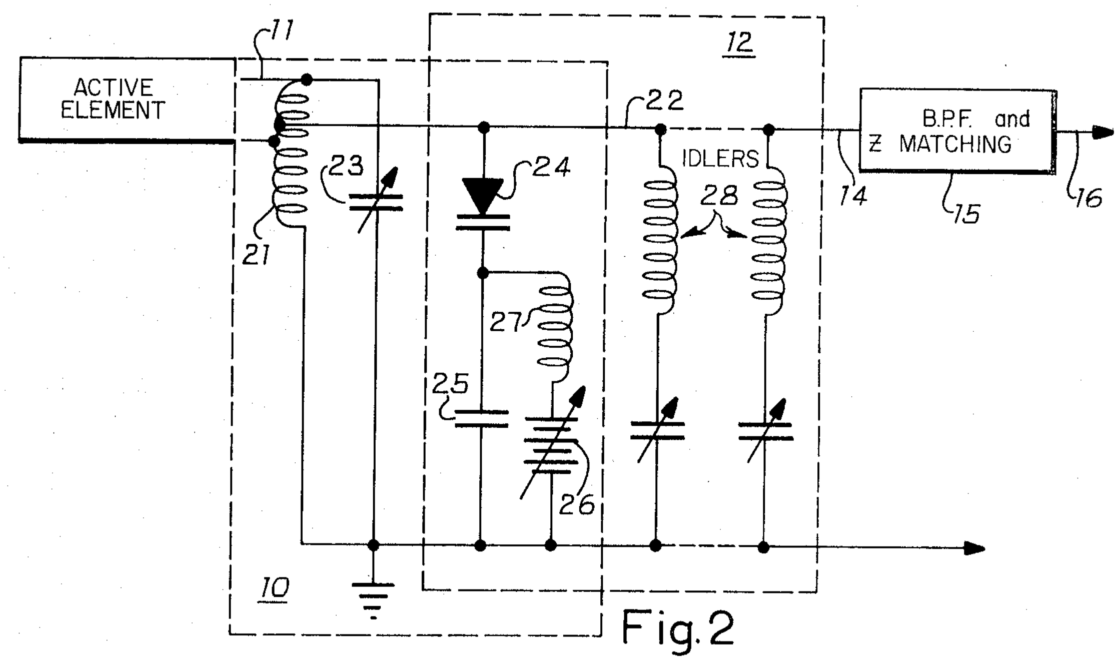
FIG. 2 is an illustration of the combination in FIG. 1 shown partly in block and partly in circuit schematic.

Referring more particularly to FIG. 2 the active element of the oscillator 10 produces the output frequency $f_o$ on the output 11 which is coupled to an inductance 21 to which the output 11 is tapped. The inductance 21 is coupled to a conductor 22 and the inductance 21 is also coupled between the conductor 11 and a fixed potential, such as ground. In parallel with the inductance 21 is a variable capacitor 23 to adjust the capacity reactance in the tuning circuit of the oscillator 10. In series between the conductor 22 and ground is a varactor 24 having its anode coupled to the conductor 22 and its cathode coupled to one plate of a DC blocking capacitor 25, the opposite plate of which is coupled to ground. The cathode of the varactor 24 is coupled to the DC biasing input 13, herein illustrated as being an adjustable battery source 26 coupled through an inductance 27 to the cathode. Between the varactor and the band pass filter 15 are idlers 28, herein shown to be two although one or more idlers may be used as desired to produce the desired multiplication and to increase the gain of the circuit. The overlap of the dashed lines enclosing the oscillator 10 and the multiplier 12 illustrates the dual function of the varactor 24 in the combination. The conductor 22 is coupled to the band pass filter 15 through the proper impedance matching elements within the filter. The varactor 24 has an inherent capacitive reactance and this varactor is operated within the range of its characteristics where it is nonconductive. The adjustment of the DC bias voltage 26 across the varactor 24 produces a change in its capacitive reactance in the tuned circuit involving the varactor 24, the inductance 21, and capacitor 23 to vary the frequency of oscillator 10 although this change in bias has some affect on the power output of the desired frequency $nf_o$.

Figure 3:
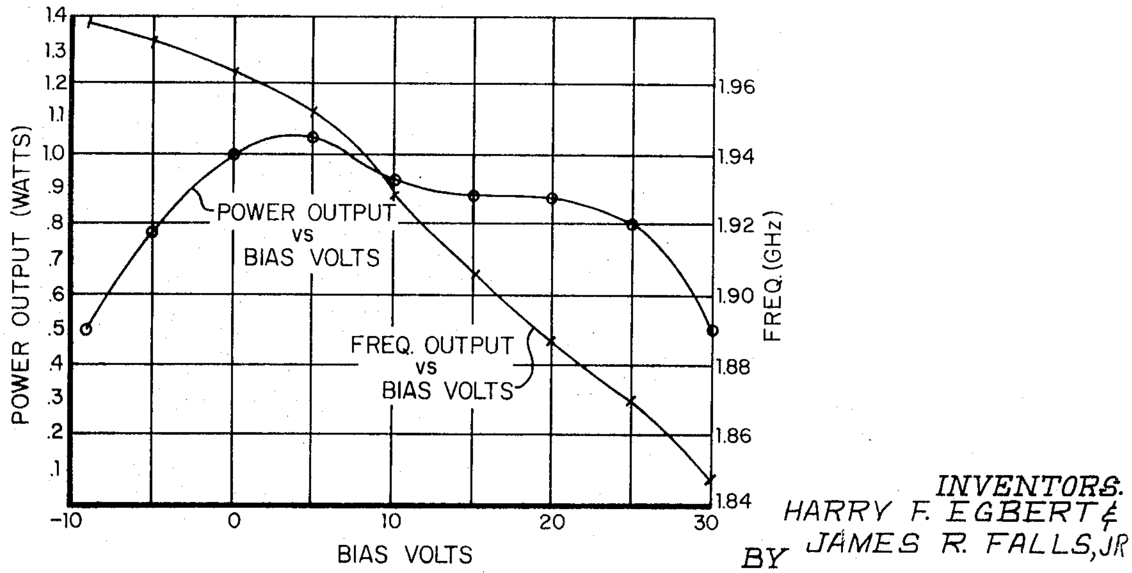
FIG. 3 is a graph of the frequency produced in proportion to a bias voltage and the power output produced with respect to the bias voltage upon the varactor diode.

Referring more particularly to FIG. 3 an example of the frequency and power changes occurring with a change in the DC bias voltage is shown herein which illustrates that the frequency and power output curves cross at about nine and one-half volts of bias potential. The region of the linear portions of these two curves provides the best power output of the VCOM and, accordingly, a single varactor provides both the tuning in the circuit, as a formerly used tuning diode, in addition to its function, by a separate diode in prior known circuits, for frequency multiplication. By this construction ferrite oscillators or resistive attenuators, formerly used to isolate the oscillator from the multiplier, are not needed and thus greatly simplifies this circuit to accomplish the desirable results. Accordingly, there is an increase in reliability by the elimination of the normally required tuning diode and the components associated with its bias circuit. The output frequency of high power oscillators is accomplished over a large range without generating additional FM noise. Accordingly, desired oscillation in the UHF frequency bands are accomplished with this structure, with good reliability and with a minimum of parts.

While a preferred embodiment is disclosed herein, it is to be understood that changes may be made therein to accomplish different power output and frequency output results with adjustment of the DC bias and we desire to be limited in the spirit of this invention only by the scope of the appended claims.

We claim:

1. A voltage controlled oscillator-multiplier comprising:

an oscillator circuit for generating a fundamental frequency of oscillations;

a band pass filter for passing a desired frequency band;

a tuning varactor diode circuit coupled across the output of said oscillator and coupled to the input of said band pass filter to multiply the frequency generated by said oscillator and to pass the desired frequency; and an adjustable direct current biasing voltage source coupled across said varactor diode for adjustably controlling the said fundamental frequency by varying the capacitive reactance thereof which diode at the same time produces frequency multiplication.

2. A voltage controlled oscillator-multiplier as set forth in claim 1 wherein said tuning varactor diode circuit includes a capacitor in series with said varactor with the anode of said varactor coupled to the output of said oscillator and said capacitor coupled to a fixed potential in common with said oscillator and said band pass filter.

3. A voltage controlled oscillator-multiplier as set forth in claim 2 wherein said adjustable direct current biasing voltage source is a variable voltage applied through an inductance to the cathode of said varactor diode.

4. A voltage controlled oscillator-multiplier as set forth in claim 3 wherein said tuning varactor diode circuit includes at least one idler to raise the gain in multiplication and to reduce the noise of said desired frequency.

* * * * *